United States Patent
Lee et al.

(10) Patent No.: US 8,593,550 B2
(45) Date of Patent: Nov. 26, 2013

(54) METHOD OF DRIVING AN IMAGE SENSOR WITH BLOOMING CURRENT

(75) Inventors: Jong-Jin Lee, Seoul (KR); Ju-Hyun Ko, Seongnam-si (KR); Jung-Chak Ahn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1168 days.

(21) Appl. No.: 12/313,350

(22) Filed: Nov. 19, 2008

(65) Prior Publication Data

US 2009/0174799 A1    Jul. 9, 2009

(30) Foreign Application Priority Data

Nov. 19, 2007    (KR) .................. 10-2007-0117792

(51) Int. Cl.
    *H04N 5/335*    (2011.01)
(52) U.S. Cl.
    USPC .......................................... 348/294; 348/314
(58) Field of Classification Search
    USPC .................................................. 438/57
    See application file for complete search history.

(56) References Cited

U.S. PATENT DOCUMENTS

| | | | |
|---|---|---|---|
| 6,974,943 B2 * | 12/2005 | Manabe et al. | 250/208.1 |
| 2002/0048837 A1 * | 4/2002 | Burke et al. | 438/48 |
| 2005/0083421 A1 * | 4/2005 | Berezin et al. | 348/308 |
| 2006/0065811 A1 * | 3/2006 | Yoon et al. | 250/208.1 |
| 2006/0076588 A1 * | 4/2006 | Nozaki | 257/292 |
| 2006/0249731 A1 * | 11/2006 | Ladd | 257/59 |
| 2007/0045681 A1 * | 3/2007 | Mauritzson et al. | 257/292 |
| 2008/0179642 A1 * | 7/2008 | Lee et al. | 257/292 |
| 2009/0101796 A1 * | 4/2009 | Ladd et al. | 250/206 |
| 2009/0189057 A1 * | 7/2009 | Asaba et al. | 250/208.1 |

* cited by examiner

*Primary Examiner* — Nicholas Giles
*Assistant Examiner* — Abdelaaziz Tissire
(74) *Attorney, Agent, or Firm* — Monica H. Choi

(57) ABSTRACT

For driving an image sensor having a pixel with a transfer gate formed between a photo-detector and a floating diffusion region, a noise-reducing voltage is applied on the transfer gate during a first period of an integration mode. A blooming current voltage is applied on the transfer gate during a second period of the integration mode. A read voltage is applied on the transfer gate during a read mode after the integration mode. The read voltage has a higher magnitude than the blooming current voltage. With application of the noise-reducing voltage, noise is reduced and a dynamic range is extended for the image sensor.

20 Claims, 5 Drawing Sheets

METHOD OF DRIVING AN IMAGE SENSOR WITH BLOOMING CURRENT

This application claims priority under 35 USC §119 to Korean Patent Application No. 10-2007-117792, filed on Nov. 19, 2007 in the Korean Intellectual Property Office, the disclosure of which is incorporated herein in its entirety by reference.

BACKGROUND

1. Technical Field

The present invention relates generally to image sensors, and more particularly, to a method of driving an image sensor for reduced noise and with blooming current flow.

2. Description of the Related Art

Image sensors convert optical images into electrical signals and are widely used in electronic devices, such as digital cameras, mobile phones, etc. The image sensors are generally divided into a charge-coupled device (CCD) image sensor and a complementary metal oxide semiconductor (CMOS) image sensor.

The CCD image sensor consumes more power than the CMOS image sensor, but the CCD image sensor has less noise and better image quality in comparison with the CMOS image sensor. Since the CMOS image sensor may be produced using conventional CMOS fabrication, the CMOS image sensor is easily integrated to a peripheral system for performing operations such as amplification and signal processing, resulting in reduced manufacturing cost. Further, the CMOS image sensor has higher operating speed than the CCD image sensor.

A typical image sensor includes a pixel array including a plurality of pixels for example arranged as a two-dimensional matrix. Each pixel includes a respective photo-detector (such as a photodiode for example) for generating electric charge from received light. Each pixel also includes other devices such as transistors for converting such electric charge into an electrical signal. A pixel of the typical image sensor may have a three-transistor structure, a four-transistor structure, a structure with some transistors being shared by a plurality of pixels, or the like.

A dynamic range (DR) of an image sensor represents the capability of the image sensor to distinguish between light and shade of a subject. For example, the dynamic range may be represented as 20*log(S/N) in a unit of decibel (dB), where S represents a maximum level (i.e., a saturation level) of a signal recognizable by the image sensor, and N represents a noise level of the image sensor. Thus, the dynamic range of the image sensor may be extended by decreasing the noise level N or by increasing the saturation level S.

A linear image sensor outputs an image signal linearly proportional to an intensity of received light such that post-processing for the image signal of the linear image sensor may be easily implemented. A dynamic range of the linear image sensor, however, may be limited to below about 75 dB. Various methods have been proposed to increase the dynamic range of the linear image sensor. However, size and cost of the image sensor are generally increased by such proposed methods since the charge storage capacity of a photo-detector (e.g., a photodiode) in a pixel should be increased resulting in a limit to the increase of the dynamic range. Thus, the linear image sensor is not suitable for a device desired to have a small size.

A logarithmic image sensor uses a concept of sub-threshold conduction of a MOS (metal oxide semiconductor) transistor. Since the logarithmic image sensor generates an image signal that is logarithmically proportional to the intensity of the received light, the logarithmic image sensor may have a wider dynamic range of above about 100 dB.

The logarithmic image sensor, however, may have a long RC response time when the intensity of the received light is low. Furthermore, the logarithmic image sensor is more sensitive to noise since the logarithmic image sensor outputs an electrical signal that is compressed with respect to the received light.

Generally, an active pixel in a pixel array of an image sensor includes a transfer gate formed on a semiconductor substrate between a photo-detector and a floating diffusion region formed in the semiconductor substrate. The image sensor operates according to an integration mode and a read mode defined by a switching operation of such a transfer gate.

A typical logarithmic image sensor generates an image voltage signal that is proportional to an amount of electric charge generated by the photo-detector during the integration mode. If the amount of electric charge generated in the photo-detector (such as a photo-diode for example) during the integration mode is higher than a charge storage capacity of the photodiode, a portion of such generated electric charge is discharged as a blooming current from the photodiode.

The typical logarithmic image sensor drives the transfer gate with a voltage level near a threshold voltage during the integration mode for sub-threshold conduction through the transfer gate of the blooming current. In that case, noise may be increased from dark current flowing below the transfer gate, especially at a high temperature.

SUMMARY

Accordingly, an image sensor is driven for minimizing noise with conduction of blooming current.

A general aspect of the present invention includes a method of driving an image sensor with a pixel having a transfer gate formed between a photo-detector and a floating diffusion region. The method includes a step of applying a noise-reducing voltage on the transfer gate during a first period of an integration mode. The method also includes a step of applying a blooming current voltage on the transfer gate during a second period of the integration mode. The method further includes applying a read voltage on the transfer gate during a read mode after the integration mode. The read voltage has a higher magnitude than the blooming current voltage.

In an example embodiment of the present invention, the transfer gate is for a transfer transistor that is not depleted from the application of the noise-reducing voltage.

In another embodiment of the present invention, the transfer gate is for a transfer transistor that conducts a blooming current through the floating diffusion region from the application of the blooming current voltage.

In a further embodiment of the present invention, the transfer gate is for a transfer transistor that transfers electric charge accumulated in the photo-detector during the read mode to the floating diffusion region from the application of the read voltage.

In another embodiment of the present invention, an image signal is generated from sensing a voltage at the floating diffusion region after the transfer of the electric charge to the floating diffusion region during the read mode. For example, the pixel includes a source-follower transistor for converting the electric charge at the floating diffusion region to the image signal.

In a further embodiment of the present invention, the pixel further includes a reset transistor coupled between the floating diffusion region and a power supply. In that case, the method further comprises the steps of applying a turn-on voltage at the reset gate during the integration mode, applying a turn-off voltage on the transfer gate during a third period of the integration mode, and generating a reference signal from sensing the voltage at the floating diffusion region during the third period before the read mode. The reset gate also conducts the blooming current from the floating diffusion region to the power supply during the second period.

In an example embodiment of the present invention, the transfer gate is for a transfer transistor that is an NMOSFET (N-channel metal oxide semiconductor field effect transistor). In that case, the noise-reducing voltage is a negative voltage, the blooming current voltage is a sub-threshold voltage of the transfer transistor, and the read voltage is a positive voltage that is higher than the sub-threshold voltage.

In a further embodiment of the present invention, a path for a blooming current is formed between an N-type region of the photo-detector and the floating diffusion region within a bulk of a substrate from the application of the sub-threshold voltage on the transfer gate.

In that case, the method includes the step of controlling a location of the N-type region of the photo-detector by adjusting an implantation angle and an implantation energy during implantation of an N-type dopant for forming the N-type region. The location of the N-type region determines the path of the blooming current.

In an example embodiment of the present invention, a duration of the second period corresponds to a time for stabilizing the blooming current when the pixel operates with a logarithmic response. For example, the duration of the second period is in a range of from about one micro second to about six micro seconds.

In a further embodiment of the present invention, the sub-threshold voltage is controlled to adjust a boundary value between a linear response and a logarithmic response of the pixel.

In another embodiment of the present invention, the pixel further includes a source follower transistor coupled between the floating diffusion region and the power supply, and further includes a select transistor coupled between the source follower transistor and an output node having the image or reference signal generated thereon.

In this manner, noise is minimized in the pixel of the image sensor from application of the noise-reducing voltage on the transfer gate during the first period of the integration mode. In addition, surplus electric charge is conducted away from the photo-detector from application of the blooming current voltage on the transfer gate during the second period of the integration mode.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE EMBODIMENTS

Figure 1:
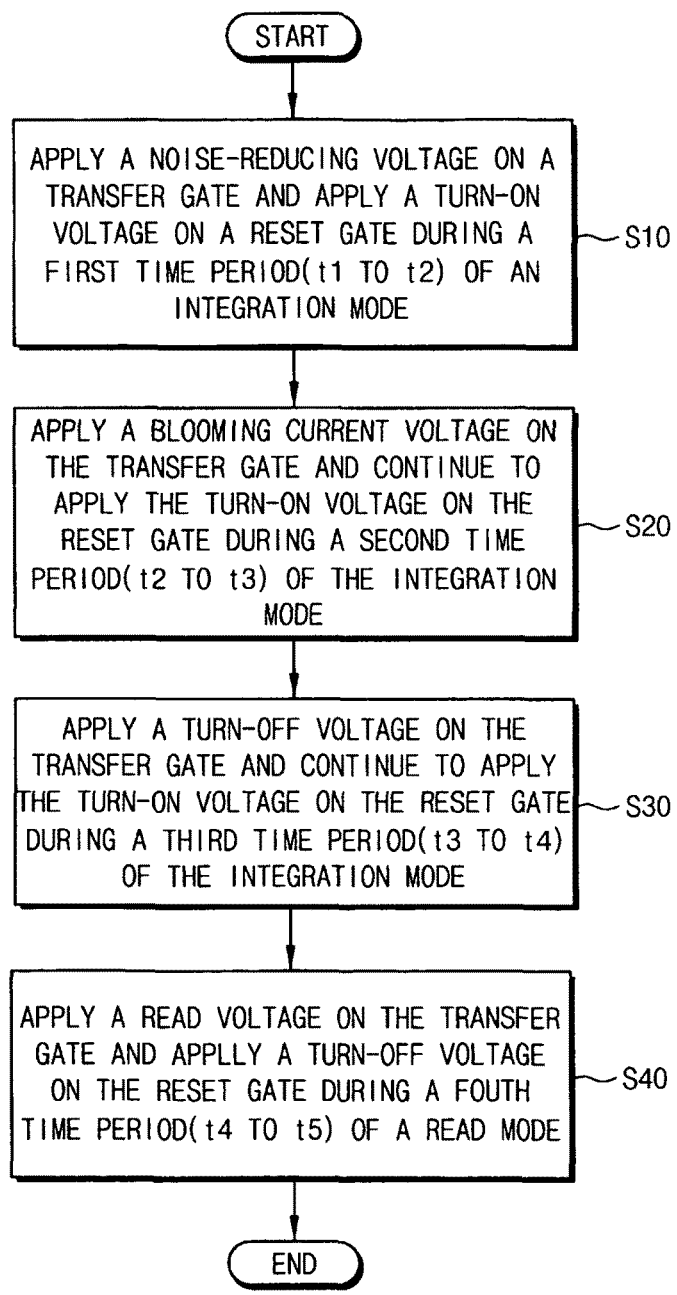
FIG. 1 is a flow chart of steps for driving an image sensor according to an example embodiment of the present invention.

Example embodiments of the present invention are described herein with reference to the accompanying drawings. However, the present invention may be embodied in many different forms and should not be construed as limited to the example embodiments set forth herein. Rather, these example embodiments are described so that this disclosure is thorough and complete for fully conveying the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
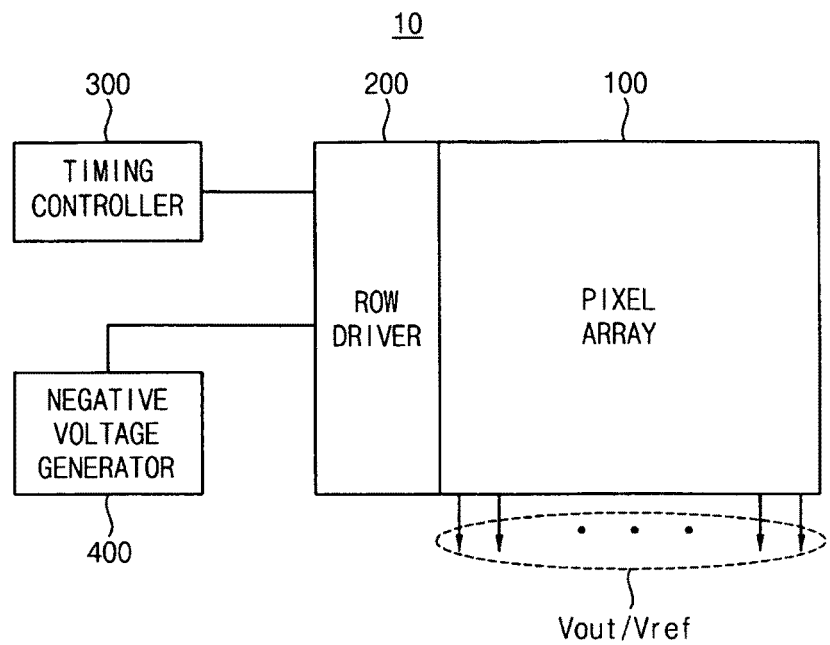
FIG. 2 is a block diagram of an image sensor driven according to the flow-chart of FIG. 1, according to an example embodiment of the present invention.

FIG. 1 shows a flow-chart of steps for driving an image sensor 10 of FIG. 2 according to an example embodiment of the present invention. For example, the flow-chart of FIG. 1 shows steps for driving an example pixel 110 of FIG. 3 in the image sensor 10, according to an example embodiment of the present invention.

FIG. 2 shows a block diagram of the image sensor 10 according to an example embodiment of the present invention. Referring to FIG. 2, the image sensor 10 includes a pixel array 100, a row driver 200, a timing controller 300, and a negative voltage generator 400.

In an example embodiment of the present invention, the pixel array 100 includes a plurality of pixels arranged in a two-dimensional matrix form. The pixels of the array are selected row by row by the row driver 200 for performing an image sensing operation. The pixel array 100 outputs an image signal Vout that is an electrical signal representing image information, and outputs a reference signal Vref for correlated double sampling (CDS).

The timing controller 300 controls timing of operations by the image sensor 10 according to operation modes. While not illustrated in FIG. 2, the image sensor 10 may further include a CDS (correlated double sampling) unit for performing correlated double sampling on the image and reference signals Vout and Vref, an analog-to-digital converter (ADC), and an interface for communicating with an external device. In that case, the timing controller 300 controls timing of operations of such elements.

Figure 3:
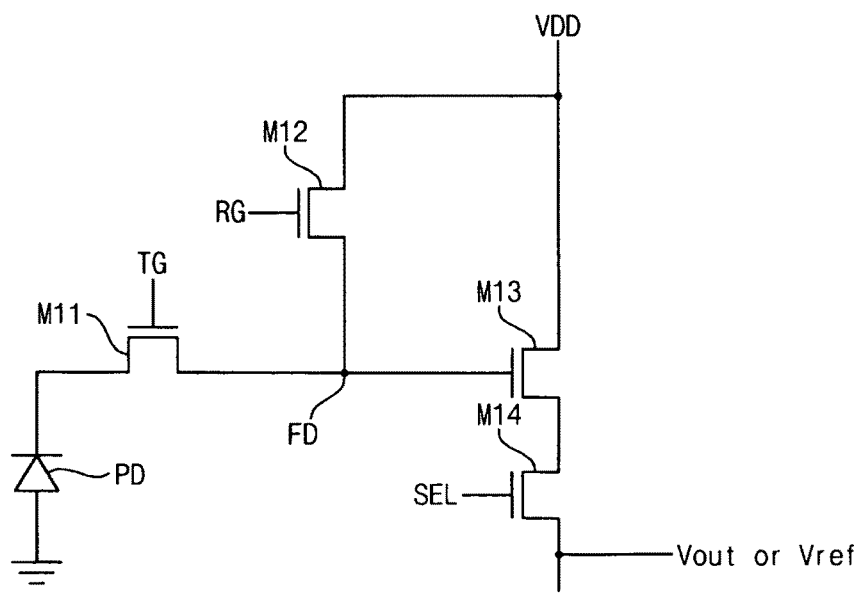
FIG. 3 is a circuit diagram of an example pixel in the image sensor of FIG. 2, according to an example embodiment of the present invention.

FIG. 3 shows a circuit diagram of the example pixel 110 in the image sensor 10 of FIG. 2, according to an example embodiment of the present invention. The image sensor 10 of FIG. 2 includes the array of pixels with each pixel implemented similarly as illustrated in FIG. 3. Referring to FIG. 3, the example pixel 110 has a four-transistor structure in an example embodiment of the present invention. However, the present invention may be practiced with the image sensor 10 having a three-transistor structure, a five-transistor structure, a structure where some transistors are shared by a plurality of pixels, or the like.

Further referring to FIG. 3, the example pixel 110 includes a photo-detector (such as a photodiode PD for example), a transfer transistor M11, a reset transistor M12, a source follower transistor M12, and a selection transistor M14, configured as illustrated in FIG. 3. In particular for example, the transfer transistor M11 is coupled between the photo-detector PD and a floating diffusion node FD.

Operation for driving the example pixel 110 of the imager sensor 10 is now described with reference to the flow-chart of FIG. 1 and the timing diagram of FIG. 4, according to an example embodiment of the present invention.

Figure 4:
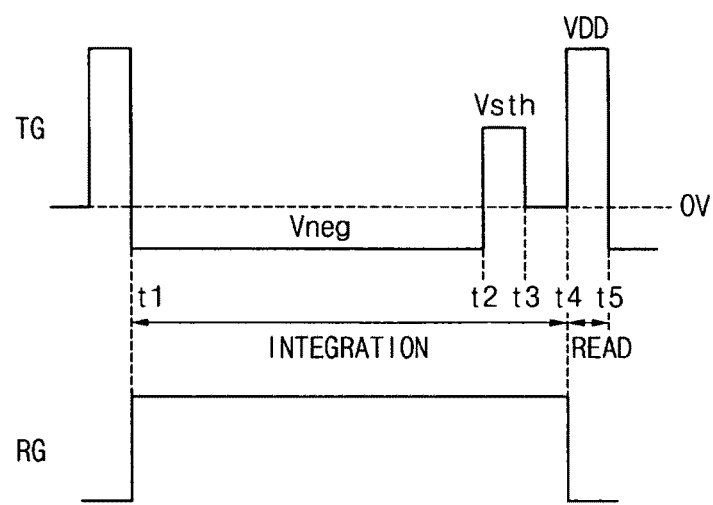
FIG. 4 is a timing diagram of control signals for driving the image sensor of FIG. 2, according to an example embodiment of the present invention.

According to an embodiment of the present invention, the image sensor 10 operates according to two modes, an integration mode (time period t1 to t4 in FIG. 4) and a read mode (time period t4 to t5 in FIG. 4). During the integration mode, charge carriers (e.g., electron-hole pairs) representing an image are collected in the photo-detector PD proportional to an intensity of light received at the photo-detector PD through an open shutter of the image sensor 10. During the read mode after the integration mode, the shutter is closed, and the charge carriers are converted into electrical signals for conveying image information.

Referring to FIGS. 1, 3, and 4, a noise-reducing voltage is applied on a transfer gate TG of the transfer transistor M11 while a turn-on voltage is applied on a reset gate RG of the reset transistor M12 during a first time period (t1 to t2 in FIG. 4) of an integration mode (step S10 of FIG. 1). In an example embodiment of the present invention, each of the transfer transistor M11, the reset transistor M12, the source follower transistor M12, and the selection transistor M14 is implemented as a respective NMOSFET (N-channel metal oxide semiconductor field effect transistor).

In that case, the noise-reducing voltage applied on the transfer gate TG during the first time period (t1 to t2 in FIG. 4) of the integration mode is a negative voltage Vneg that is less than about −0.5 V for example. In addition in that case, the turn-on voltage applied on the reset gate RG during the first time period (t1 to t2 in FIG. 4) of the integration mode is a positive voltage such as 2.8 V for example. Such a turn-on voltage applied on the reset gate RG turns on the reset transistor M12 for resetting the floating diffusion node FD to a voltage VDD of a power supply.

The image sensor 10 includes the negative voltage generator 400 for generating such a negative voltage Vneg. In general, a conventional image sensor generates positive voltages with various levels by dividing a positive power supply voltage VDD, but the conventional image sensor cannot generate the negative voltage with such voltage division. The negative voltage generator 400 is included in the image sensor 10 for generating the negative voltage Vneg for the row driver 200 by employing a charge pump or a DC-DC converter. Alternatively, the negative voltage Vneg may be provided by an external device through a pad of the image sensor 10.

Subsequently during a second time period (t2 to t3 in FIG. 4) of the integration mode, a blooming current voltage is applied on the transfer gate TG while the turn-on voltage is continued to be applied on the reset gate RG (step S20 of FIG. 1). For example when the transistors M11, M12, M13, and M14 are NMOSFETs, the blooming current voltage is a sub-threshold voltage Vsth of the transfer transistor M11 that is in a range of from about 0.7 V to about 1.2 V for example.

With application of the sub-threshold voltage Vsth on the transfer gate TG, a blooming current is conducted through the transfer transistor M11 from the photo-detector PD when the intensity of light received at the photo-detector PD is greater than a boundary value. Such a blooming current eliminates an amount of the charge carriers at the photodiode PD exceeding a charge storage capacity of the photo-detector PD. With flow of such a blooming current, the pixel 110 may generate the image signal Vout having a logarithmic characteristic.

The duration of the second time period (t2 to t3 in FIG. 4) is set to ensure stabilization of the blooming current when the pixel 110 operates with the logarithmic response. Stabilization of the blooming current is indicated when the blooming current flowing from the photo-detector PD to the floating diffusion node FD is substantially balanced with a current flowing out of the floating diffusion node FD such as to the power supply VDD through the reset transistor M12 for example.

Accordingly, the duration of the second time period (t2 to t3 in FIG. 4) may depend on characteristics of the transfer transistor M11. In an example embodiment of the present invention, the duration of the second time period (t2 to t3 in FIG. 4) is set in a range of from about one micro second to about six micro seconds.

If the number of rows of the pixel array 100 is 1,000 and a moving image is captured in 30 frames per second, an operating period for each row is about 33 micro-seconds. In this case, the duration of the second time period (t2 to t3 in FIG. 4) is set to about a few microseconds, and the first time period (t1 to t2 in FIG. 4) is set to about 25 or more micro seconds. In this manner, since the negative voltage Vneg is applied to the transfer gate TG during most of the integration mode, noise from a dark source below the transfer gate TG may be effectively suppressed for reducing noise of the image sensor 10.

Such reduced noise results in increased dynamic range of the image sensor 10. In addition, operation of the example pixel 110 in the logarithmic range also results in increased dynamic range of the image sensor 10.

For example with application of the positive sub-threshold voltage Vsth on the transfer gate TG, the image sensor 10 has a combination of a linear response and a logarithmic response. The positive sub-threshold voltage Vsth is set close to a threshold voltage of the transfer transistor M11 such that the transfer transistor M11 operates in sub-threshold. Generally in sub-threshold, a transistor conducts a drain-to-source current having an exponential dependence on a gate-to-source voltage even though a channel is not fully formed. Such a transistor operating in sub-threshold is also referred to as an incompletely turned-on transistor.

Subsequently during a third time period (t3 to t4 in FIG. 4) of the integration mode, a turn-off voltage is applied on the transfer gate TG while the turn-on voltage is continued to be applied on the reset gate RG (step S30 of FIG. 1). For example when the transistors M11, M12, M13, and M14 are NMOSFETs, the turn-off voltage is 0 Volts. During the third time period (t3 to t4 in FIG. 4), the reference voltage Vref is generated at an output node as a SEL signal is activated at the gate of the select transistor M14 that is turned on. The reference voltage Vref is generated as the source follower transistor M13 senses the voltage at the floating diffusion region FD with the reset transistor M12 being turned on to couple the voltage VDD of the power supply to the floating diffusion region FD.

Thereafter during a fourth time period (t4 to t5 in FIG. 4) of the read mode after the integration mode, a read voltage is applied on the transfer gate TG while a turn-off voltage is applied on the reset gate RG (step S40 of FIG. 1). For example when the transistors M11, M12, M13, and M14 are NMOSFETs, the read voltage is a positive voltage that is higher than the sub-threshold voltage Vsth of the transfer transistor M11. For instance, the read voltage applied on the transfer gate TG during the fourth time period (t4 to t5 in FIG. 4) is the power supply voltage VDD that is about 2.8 Volts.

With such a read voltage applied at the transfer gate TG during the read mode, charge carriers collected in the photo-diode PD are transferred to the floating diffusion node FD. The voltage of the floating diffusion node FD decreases in proportion to the amount of transferred charge carriers, and a source voltage of the source follower transistor M13 changes accordingly. When the selection signal SEL applied at the gate of the selection transistor M14 is activated, the image signal Vout is generated at the output node.

As will be described with reference to FIG. 6, the image signal Vout may be processed by dividing responses of the image sensor 10 into a linear response and a logarithmic response according to levels of the image signal Vout. Description of post-processing of the image signal Vout, such as calibration based on dark levels, signal recovery algorithm related to the logarithmic response, etc., are omitted herein.

Also with the turn-off voltage applied at the reset gate RG, the reset transistor M12 is turned off for electrically disconnecting the floating diffusion region FD from the power supply voltage VDD during the read mode.

The method of driving the image sensor 10 as illustrated in FIG. 1 may be applied to image sensors of a global shutter type or a rolling shutter type. For example, when a still image is captured in an image sensor of the global shutter type, a shutter is open for all rows of pixels during the integration mode from t1 to t4, and the read voltage VDD is applied to the transfer gates of each row in a row-by-row sequence during the read mode from t4 to t5. In an image sensor of the rolling shutter type, operations of the integration mode from t1 to t4 and the read mode from t4 to t5 are repeated for each row.

Figure 5:
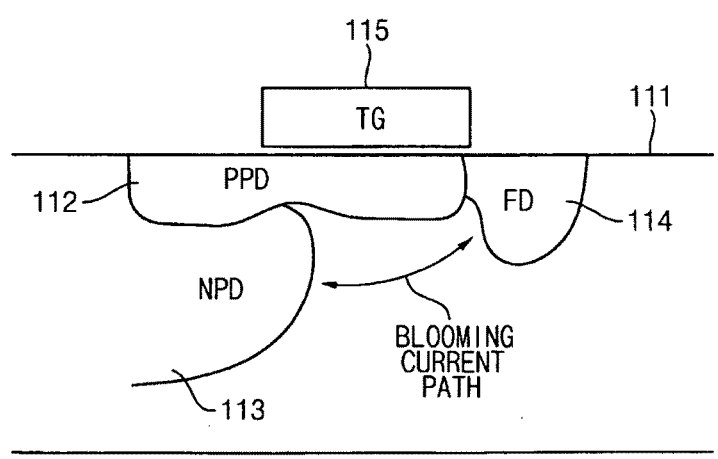
FIG. 5 is a cross-sectional diagram of portions of the pixel of FIG. 3 illustrating a path for a blooming current, according to an example embodiment of the present invention.

FIG. 5 shows a cross-sectional view of portions of the pixel 110 of FIG. 3 illustrating the path of the blooming current, according to an example embodiment of the present invention. Referring to FIGS. 3 and 5, the photo-detector PD is formed from a P-type photo-diode (PPD) region 112 and an N-type photo-diode (NPD) region 113 within a semiconductor substrate 111. In addition, the transfer transistor M11 is formed from the P-type photo-diode (PPD) region 112, the floating diffusion region 114, and a transfer gate 115 formed over the substrate 111.

Charge carriers generated during the integration mode are collected in the N-type photo-diode (NPD) region 113. In the method of driving the image sensor 10 according to the example embodiment of FIG. 1, with the negative voltage Vneg being applied to the transfer gate 115 during most of the integration mode, holes are collected in the semiconductor substrate 111 below the transfer gate 115 such that a depletion layer is not formed therein.

In addition, the path for the blooming current is formed in the bulk portion of the semiconductor substrate 111 between the N-type photo-diode (NPD) region 113 and the floating diffusion region 114. The N-type and P-type photo-detector regions 112 and 113 and the floating diffusion region 114 are formed in the substrate 111 by ion implantations of respective dopants. The path of the blooming current within the bulk of the substrate 111 may be controlled by adjusting respective implantation angles and respective implantation energies during such ion implantations.

For example, the location of the N-type photo-detector region 113 is determined from the implantation angle and the implantation energy of an N-type dopant that is implanted into the substrate 111 for forming the N-type photo-detector region 113. The location of the N-type photo-detector region 113 determines the path of the blooming current from the N-type photo-detector region 113 to the floating diffusion region 114.

Figure 6:
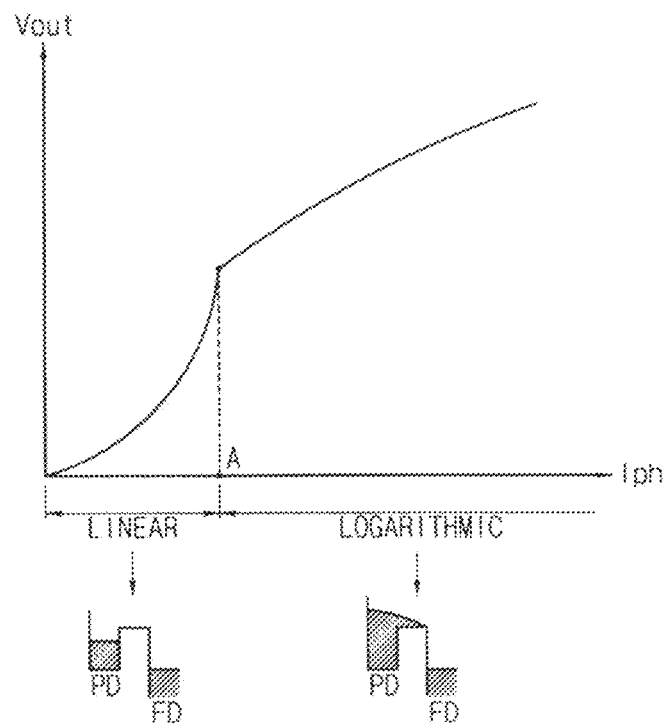
FIG. 6 is a plot illustrating linear and logarithmic operating regions of the image sensor of FIG. 2, according to an example embodiment of the present invention.

FIG. 6 is a plot illustrating linear and logarithmic operating regions of the image sensor 10 of FIG. 2, according to an example embodiment of the present invention. Referring to FIG. 6, in the method of driving the image sensor 10 according the example embodiment of FIG. 1, the image signal Vout generated by the example pixel 110 has a response characteristic with a combination of a linear response and a logarithmic response.

Further referring to FIG. 6, the image signal Vout has a linear response characteristic when a photocurrent Iph having a level corresponding to the intensity of light received at the photo-detector PD is lower than a boundary value A for a linear operating region of the image sensor 10. In addition, the image signal Vout has a logarithmic response characteristic when such a photocurrent Iph is higher than the boundary value A for a logarithmic operating region of the image sensor 10.

In turn, the response of the example pixel 110 of the image sensor 10 is divided into the linear response and the logarithmic response according to whether a level of the image signal Vout exceeds a corresponding level for the boundary photo-current value A. A signal indicating the intensity of the light received at the photo-detector is recovered by processing the image signal Vout according to a respective algorithm corresponding to each of the linear response and the logarithmic response.

Figure 7:
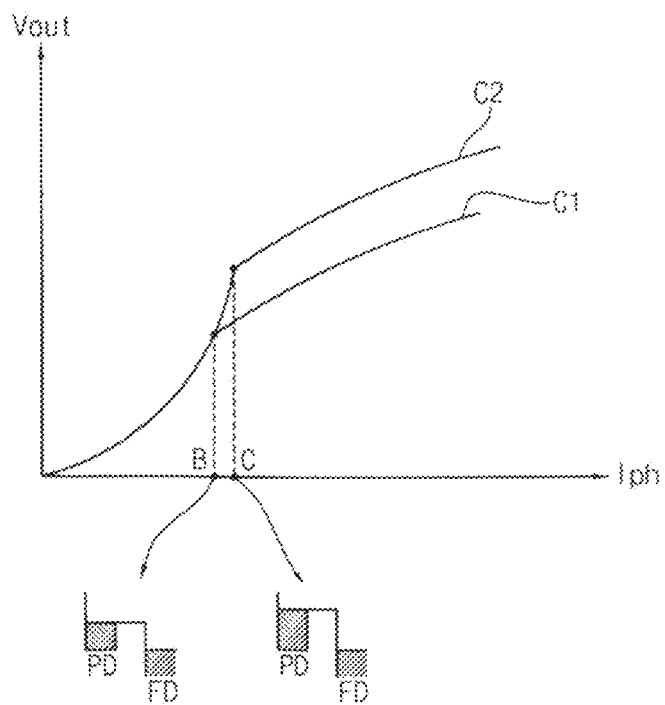
FIG. 7 shows plots for illustrating a method of adjusting a boundary value between the linear and logarithmic operating regions of the image sensor of FIG. 2, according to an example embodiment of the present invention.

FIG. 7 shows plots for illustrating a method of adjusting the boundary value between the linear and logarithmic operating regions of the image sensor 10 of FIG. 2, according to an example embodiment of the present invention. Referring to FIG. 7, a first curve C1 represents a case where the boundary value B between the linear and logarithmic operating regions of the image sensor 10 is relatively low. In addition, a second curve C2 represents a case where the boundary value C between the linear and logarithmic operating regions of the image sensor 10 is relatively high.

Referring to FIGS. 3, 4, and 7, the boundary value (A, B, or C) between the linear response and the logarithmic response is adjusted by controlling the sub-threshold voltage Vsth applied to the transfer gate TG during the second time period (t2 to t3 in FIG. 4) of the integration mode. In other words, when the sub-threshold voltage Vsth is adjusted to a relatively low level according to characteristics of the transfer transistor M11, a potential barrier between the photodiode PD and the floating diffusion region FD is decreased such that the boundary value B of the photocurrent Iph and the corresponding image signal Vout between the linear and logarithmic operating regions of the example pixel 110 are lower as the first curve C1.

On the other hand, when the sub-threshold voltage Vsth is adjusted to a relatively high level according to characteristics of the transfer transistor M11, the potential barrier between the photodiode PD and the floating diffusion region FD is increased such that the boundary value C of the photocurrent Iph and the corresponding image signal Vout between the linear and logarithmic operating regions of the example pixel 110 are higher as the second curve C2.

Figure 8:
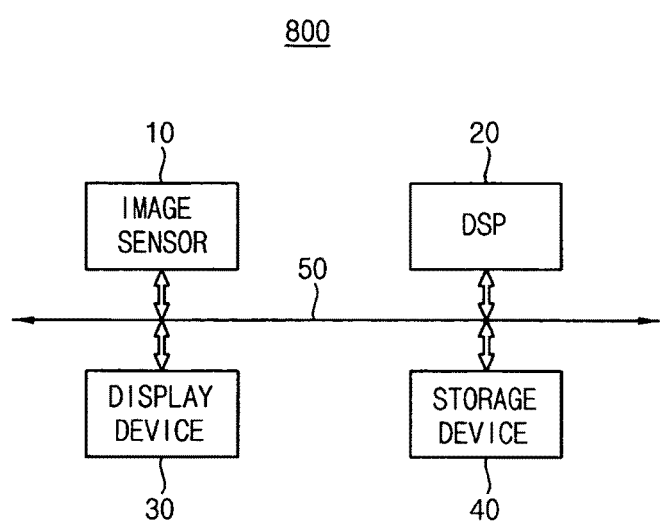
FIG. 8 is a block diagram of a system including the image sensor of FIG. 2, according to an example embodiment of the present invention.

FIG. 8 is a block diagram of a system 800 including the image sensor 10 of FIG. 2, according to an example embodiment of the present invention. Referring to FIG. 8, the system 800 includes the image sensor 10, a digital signal processor 20, a display device 30, and a storage device 40, which are coupled to each other through a bus 50. Such an image sensor 10 has wide dynamic range with reduced noise for improved performance of the whole system 800.

However, the image sensor 10 with the above-described method of driving the image sensor 10 may also be applied to any types of devices and/or systems including an image sensor, such as a digital camera, a mobile phone, a computing system, a gaming machine, a scanner, a vision system, a surveillance system, a vehicle navigation system, etc.

In this manner, performance of the image sensor is improved from extension of the dynamic range with both the linear and logarithmic responses without an increase of size of the image sensor. Furthermore, noise of the image sensor is reduced by eliminating a dark noise source below the transfer gate TG with application of the negative voltage Vneg on the transfer gate TG during most of the integration mode.

The present invention is amenable for an image sensor and/or a device including the image sensor with a wide dynamic range. Furthermore, the present invention is especially suitable for mobile devices with small size since noise is reduced and dynamic range is extended without an increase of size of the image sensor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The present invention is limited only as defined in the following claims and equivalents thereof.

What is claimed is:

1. A method of driving an image sensor having a pixel with a transfer gate formed between a photo-detector and a floating diffusion region, the method comprising:
applying a noise-reducing voltage on the transfer gate during a first period of an integration mode;
applying a blooming current voltage on the transfer gate during a second period of the integration mode; and
applying a read voltage on the transfer gate during a read mode after the integration mode, wherein the read voltage has a higher magnitude than the blooming current voltage,
wherein the pixel has a reset gate that is turned on with a constant turn-on voltage applied on the reset gate during said integration mode, and wherein the transfer gate is turned on only once during any time of the constant turn-on voltage being applied on the reset gate immediately before and during the integration mode.

2. The method of claim 1, wherein the transfer gate is for a transfer transistor that is not depleted from said application of the noise-reducing voltage.

3. The method of claim 1, wherein the transfer gate is for a transfer transistor that conducts a blooming current through the floating diffusion region from said application of the blooming current voltage.

4. The method of claim 1, wherein the transfer gate is for a transfer transistor that transfers electric charge accumulated in the photo-detector during the read mode to the floating diffusion region from said application of the read voltage.

5. The method of claim 4, further comprising:
generating an image signal from sensing a voltage at the floating diffusion region after said transfer of said electric charge to the floating diffusion region during the read mode.

6. The method of claim 5, wherein the pixel includes a source-follower transistor for converting the electric charge at the floating diffusion region to the image signal.

7. The method of claim 5, wherein the pixel further includes a reset transistor having the reset gate and coupled between the floating diffusion region and a power supply, and wherein the method further comprises:
applying a turn-on voltage at the reset gate during the integration mode;
applying a turn-off voltage on the transfer gate during a third period of the integration mode; and
generating a reference signal from sensing the voltage at the floating diffusion region during the third period before the read mode.

8. The method of claim 1, further comprising:
applying a turn-off voltage on the transfer gate during a third period of the integration mode.

9. The method of claim 1, wherein the transfer gate is for a transfer transistor that is an NMOSFET (N-channel metal oxide semiconductor field effect transistor).

10. The method of claim 9, wherein the noise-reducing voltage is a negative voltage, and wherein the blooming current voltage is a sub-threshold voltage of the transfer transistor, and wherein the read voltage is a positive voltage that is higher than the sub-threshold voltage.

11. The method of claim 10, wherein a path for a blooming current is formed between an N-type region of the photo-detector and the floating diffusion region within a bulk of a substrate from said application of the sub-threshold voltage on the transfer gate.

12. The method of claim 11, further comprising:
controlling a location of the N-type region of the photo-detector by adjusting an implantation angle and an implantation energy during implantation of an N-type dopant for forming the N-type region, wherein said location of the N-type region determines said path of the blooming current.

13. A method of driving an image sensor having a pixel with a transfer gate formed between a photo-detector and a floating diffusion region, the method comprising:
applying a noise-reducing voltage on the transfer gate during a first period of an integration mode;
applying a blooming current voltage on the transfer gate during a second period of the integration mode; and
applying a read voltage on the transfer gate during a read mode after the integration mode, wherein the read voltage has a higher magnitude than the blooming current voltage,
wherein the transfer gate is tuned on only once during any time of a constant turn-on voltage being applied on a reset gate immediately before and during the integration mode,
wherein a path for a blooming current is formed between the photo-detector and the floating diffusion region within a bulk of a substrate from said application of a sub-threshold voltage on the transfer gate, and
wherein a duration of said second period corresponds to a time for stabilizing the blooming current when the pixel operates with a logarithmic response.

14. The method of claim 13, wherein the duration of said second period is in a range of from about one micro second to about six micro seconds.

15. The method of claim 10, further comprising:
controlling the sub-threshold voltage to adjust a boundary value between a linear response and a logarithmic response of the pixel.

16. The method of claim 1, wherein the pixel further includes a reset transistor coupled between the floating diffusion region and a power supply.

17. The method of claim 16, further comprising:
applying a turn-on voltage at the reset gate of the reset transistor during the integration mode.

18. The method of claim 17, further comprising:
applying a turn-off voltage at the reset gate during the read mode.

19. The method of claim 17, wherein the transfer gate is for a transfer transistor that conducts a blooming current through the floating diffusion region from said application of the blooming current voltage, and wherein the reset gate conducts the blooming current from the floating diffusion region to the power supply during said second period.

20. The method of claim 16, wherein the pixel further includes a source follower transistor coupled between the floating diffusion region and the power supply, and further includes a select transistor coupled between the source follower transistor and an output node.

* * * * *